United States Patent [19]
Schade

[11] 4,147,579
[45] Apr. 3, 1979

[54] METHOD OF PRODUCING AN ELECTRIC COMPONENT CONSISTING OF ELEMENTS JOINED BY AN INSULATING CO-POLYMER LAYER

[75] Inventor: Reinhart Schade, Munich, Fed. Rep. of Germany

[73] Assignee: Siemens Aktiengesellschaft, Berlin & Munich, Fed. Rep. of Germany

[21] Appl. No.: 698,786

[22] Filed: Jun. 22, 1976

[30] Foreign Application Priority Data

Jul. 17, 1975 [DE] Fed. Rep. of Germany ....... 2532009

[51] Int. Cl.$^2$ ..................... B32B 31/18; B32B 31/20
[52] U.S. Cl. .................... 156/252; 29/25.35; 29/626; 29/DIG. 1; 156/272; 156/298; 156/299; 156/309; 310/364; 361/400; 361/418
[58] Field of Search ............. 156/252, 233, 261, 265, 156/272, 275, 297, 299, 309, 64, 298; 310/345, 348, 364; 361/400, 403, 417, 418, 419; 29/25.35, 592, 626, DIG. 1; 73/17 R

[56] References Cited
U.S. PATENT DOCUMENTS

| | | | |
|---|---|---|---|
| 2,969,300 | 1/1961 | Franz | 156/233 |
| 3,113,287 | 12/1963 | Renner | 310/345 X |
| 3,131,557 | 5/1964 | Hoy | 73/17 R |
| 3,290,479 | 12/1966 | Avedissian | 73/17 R |
| 3,448,516 | 6/1969 | Buck | 29/626 |
| 3,517,438 | 6/1970 | Johnson et al. | 29/626 |
| 3,520,751 | 7/1970 | Cranfill | 156/261 |
| 3,547,724 | 12/1970 | Zagusta | 156/233 |
| 3,629,042 | 12/1971 | Cranfill | 156/298 X |

*Primary Examiner*—Michael G. Wityshyn
*Attorney, Agent, or Firm*—Hill, Gross, Simpson, Van Santen, Steadman, Chiara & Simpson

[57] ABSTRACT

An electric component comprising at least two flat elements is produced by coating a side of one of the elements, a metal sheet, with a co-polymer layer or by taking a sheet having a co-polymer layer thereon, and punching first elements therefrom. The co-polymer layer is softened by heating and the second element is pressed controllably onto the first and into the co-polymer layer. The layer does not run and so maintains an insulating separation between the elements, while bonding the elements firmly together. Piezoceramic resonators and semi-conductors circuits are advantageously joined to punch-formed parts in this manner.

1 Claim, 1 Drawing Figure

METHOD OF PRODUCING AN ELECTRIC COMPONENT CONSISTING OF ELEMENTS JOINED BY AN INSULATING CO-POLYMER LAYER

BACKGROUND OF THE INVENTION

1. Field of the Invention

The present invention relates to a process for producing an electrical component part of two generally flat elements, and the product produced thereby.

2. The Prior Art

Electric components often consist of a metal sheet element serving as a carrier of another element and being physically connected thereto. The two elements are generally insulated from one another by the insertion of an intermediate layer. High-grade insulating materials in sheet form are interposed between the component elements and adhered thereto under pressure by a hot- or cold-setting adhesive. This method of production consumes time in applying the adhesive on one or both sides of the intermediate layer. In some cases the separate insulating layer has been replaced by a thicker coating of adhesive, but no adhesive has been found possessing the necessary insulating characteristics and the necessary adhesive strength. The adhesive further must not run when heated and/or compressed so that the surfaces contact and short circuit to one another. Especially where individual surfaces of the elements to be joined are quite small, unusual demands are made of the adhesive layer's properties.

Co-polymers, comprising a mixture of olefins, acrylic acid, and acrylic acid esters, have been used as coating materials for aluminum foils, for example, for cable sheetings. Co-polymers have also found application in the permanent connection of polyethylene parts to metal. No method has been previously known in which the manufacturing process for production of large quantities of electrical component parts may be increased in speed, while decreasing the expenditure of material per item while maintaining or improving the quality of the component parts.

SUMMARY OF THE INVENTION

A co-polymer layer is employed as both an insulating and connecting layer between electric component elements, wherein the co-polymer is applied to the full surface of a sheet metal material before parts are stamped therefrom. The co-polymer layer, in addition to its good dielectric characteristics and good adhesive strength, does not run when the elements are joined together under heat and pressure, and prevents any surface contact of the two elements.

The invention is especially advantageously employed where the element to be joined to the stamped part is a ceramic substrate, in particular an integrated semiconductor component element or a piezo-ceramic disk. The connecting surface of the ceramic substrate can be a structural surface of the element with a synthetic resin coating. The surface unites homogeneously with the co-polymer layer without damage to the conductor path structures of the element arising from the surface pressures and elevated temperatures for softening of the co-polymer layer. The co-polymer layer is also resistant to mechanical vibrations, having a slight cushioning effect.

DESCRIPTION OF THE PREFERRED EMBODIMENTS

Figure 1:
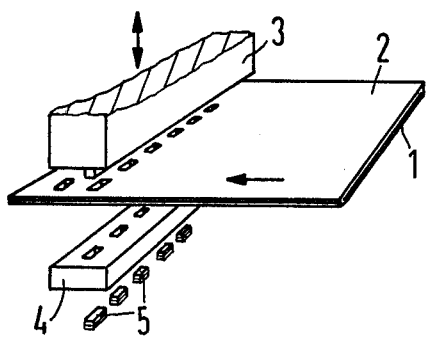
FIG. 1 is a perspective view of a first, punching step in the practice of the method of the invention.

FIG. 1 shows a sheet metal panel 1, having for example a thickness of 0.8 mm, with a co-polymer layer 2 of, for example, a thickness of 0.015 mm, applied in a prior coating process, not shown. The metal of the panel 1 is a non-rusting material, such as nickel-silver, brass, or the like. A multi-cut punch 3 and cutting matrix 4 cooperate to stamp parts 5 from the plate 1. The co-polymer layer 2 does not impair the stamping operation. Once formed, the parts 5 may be coated with a further co-polymer layer on all sides. The parts 5 may have any desired form, such as the irregular form 5a shown in FIG. 2 and the circular form 5b shown in FIG. 3.

Figure 2:
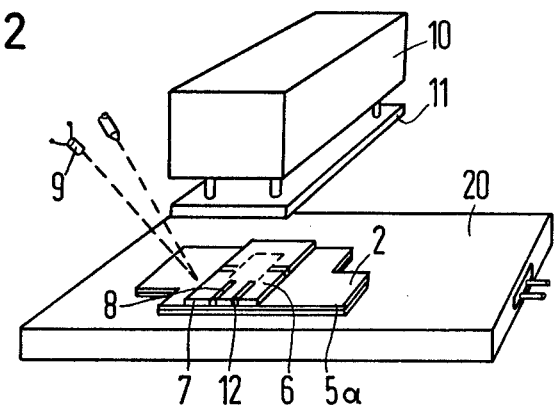
FIG. 2 is a perspective view of a second, heating and pressing step in the method of the invention.

As shown in FIG. 2, a semiconductor component element 6 having a ceramic substrate 7 with a thick layer circuit 8 applied thereon is connected to the punch-formed part 5a. The connection is accomplished by laying the part 5a onto a heating plate 20 and heating the part to a softening temperature of the co-polymer lay 2, about 100° to 110° C. A second component element 6 is then situated on the part 5a. An electro-optical measurement and control unit 9 recognizes the changing of the co-polymer layer from solid into a viscous phase.

As soon as the softening occurs, a pressure stamp 10 is activated to press the component element 6 against the co-polymer layer 2 of the part 5 at a desired pressure. This pressure will amount to 5 to 10 N/cm$^2$, depending on the type of connection desired. The pressure stamp 10 is for this purpose preferably fitted with a pressure plate 11 which is spring mounted and connected to reverse the pressure stroke as soon as a specific spring-deflection has occured. The pressure plate 11 preferably carries a protective layer to avoid damage to the semiconductor element 6. As soon as the component 6 has been pressed into the punch-formed part 5, the co-polymer cools and firmly connects the two parts together. Conductor path 12 on the edges of the semiconductor element 6 remain insulated from one another above the co-polymer layer 2.

Figure 3:
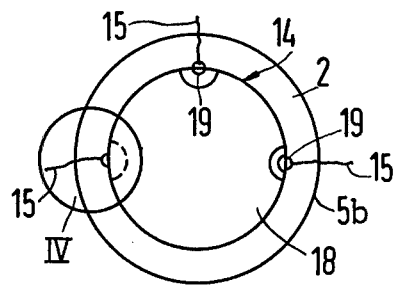
FIG. 3 is a top plan view of an electric component constructed in accordance with the invention.
Figure 4:
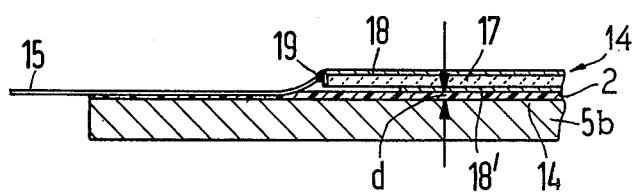
FIG. 4 is an enlarged, cross-sectional view on a radius of the portion of FIG. 3 marked as IV.

In FIGS. 3 and 4 a punch-formed part 5b is shown, shaped in the form of a circular disk and having a co-polymer layer 2 upon an upper surface thereof. A piezo-ceramic oscillator or resonator 14, having a thickness of for instance 0.14 mm, is firmly connected to the co-polymer layer of the disk 5b. Then, lacquer-insulated wires 15 are connected to the oscillator 14 at solder points 19 as shown. When the ceramic disk 14 is pressed against the insulating layer 2, the connecting wires 15 are also simultaneously pressed against the insulating layer 2 of the circular disk 5b. The imbedding of the wires 15 in the layer 2 protects the wires 15 and the connection 19 from breaking, while maintaining the insulation between the parts.

As can be seen from the section of FIG. 4 taken at IV in FIG. 3, the resonator 14 comprises a ceramic disk 17 coated on both sides with an electrically conductive material layer 18, 18'. The ceramic disk 17 is contacted at one of the layers 18, 18', by one of the soldering lugs 19, to a connecting wire 15.

As shown in FIG. 4, the conductor layer 18' is affixed to the co-polymer layer 2 of the parts 5b. The thickness d of the co-polymer layer 2 is slightly decreased in the pressing operation, but no electrical connection between the electrically conductive layer 18' and the metal disk 5b occurs. The wires 15 may be connected to or imbedded in the co-polymer layer 2 either simultaneously with the operation connecting the piezoceramic disk 14 to the part 5b, or subsequently.

Heating of the co-polymer layer 2 may be carried out either by the heating plate 20, by heat radiation, or, depending on the type of component elements to be connected, in a high-frequency electric field. Alternatively, if the component element facing the pressure stamp 11 is relatively thin, the stamp 11 may alternatively or also be heated.

Although various minor modifications may be suggested by those versed in the art, it should be understood that I wish to embody within the scope of the patent warranted hereon all such modifications as reasonably and properly come within the scope of my contribution to the art.

I claim as my invention:

1. A process for producing an electric component part having at least two elements joined to one another by an insulating copolymer layer, comprising:
   stamp-punching a first element from a metal sheet having an insulating copolymer on at least one side thereof;
   heating said first element with said copolymer layer thereon to a softening temperature of said copolymer; and
   pressing a second element onto the so-heated copolymer layer on the first element while substantially simultaneously embedding electrically-conductive wires connected to the second element into said heated copolymer layer.

* * * * *